United States Patent
Pan et al.

(10) Patent No.: US 7,074,657 B2
(45) Date of Patent: Jul. 11, 2006

(54) LOW-POWER MULTIPLE-CHANNEL FULLY DEPLETED QUANTUM WELL CMOSFETS

(75) Inventors: James N. Pan, Fishkill, NY (US); John G. Pellerin, Hopewell Junction, NY (US); Jon Cheek, Wallkill, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 165 days.

(21) Appl. No.: 10/706,948

(22) Filed: Nov. 14, 2003

(65) Prior Publication Data

US 2005/0104140 A1 May 19, 2005

(51) Int. Cl.
*H01L 21/336* (2006.01)

(52) U.S. Cl. ........................ 438/193; 438/300

(58) Field of Classification Search ........ 438/282–283, 438/156, 173, 192, 212, 268, 209, 266, 593, 438/193, 197, 199, 300, 585; 257/241, 287, 257/326, 331–332, 401, 243
See application file for complete search history.

(56) References Cited

U.S. PATENT DOCUMENTS

| | | | |
|---|---|---|---|
| 5,153,688 A * | 10/1992 | Oda et al. ................. | 257/24 |
| 5,500,545 A | 3/1996 | Cheng et al. | |
| 6,166,412 A * | 12/2000 | Kim et al. ................. | 257/366 |
| 6,864,507 B1 * | 3/2005 | Yokogawa et al. ........... | 257/77 |
| 6,919,250 B1 * | 7/2005 | Krivokapic ................. | 438/283 |
| 2002/0115240 A1 | 8/2002 | Nowak et al. | |
| 2004/0063286 A1 * | 4/2004 | Kim et al. ................. | 438/283 |
| 2004/0262690 A1 * | 12/2004 | Coronel et al. ............ | 257/365 |
| 2005/0023619 A1 * | 2/2005 | Orlowski et al. ........... | 257/401 |

OTHER PUBLICATIONS

"New FET on SOI Structure", IBM Technical Disclosure Bulletin, IBM Corp, New York, Sep. 1, 1991, vol. 34, No. 4A, p. 369.

* cited by examiner

*Primary Examiner*—Anh Duy Mai

(57) ABSTRACT

A multiple-channel semiconductor device has fully or partially depleted quantum wells and is especially useful in ultra large scale integration devices, such as CMOSFETs. Multiple channel regions are provided on a substrate with a gate electrode formed on the uppermost channel region, separated by a gate oxide, for example. The vertical stacking of multiple channels and the gate electrode permit increased drive current in a semiconductor device without increasing the silicon area occupied by the device.

6 Claims, 8 Drawing Sheets

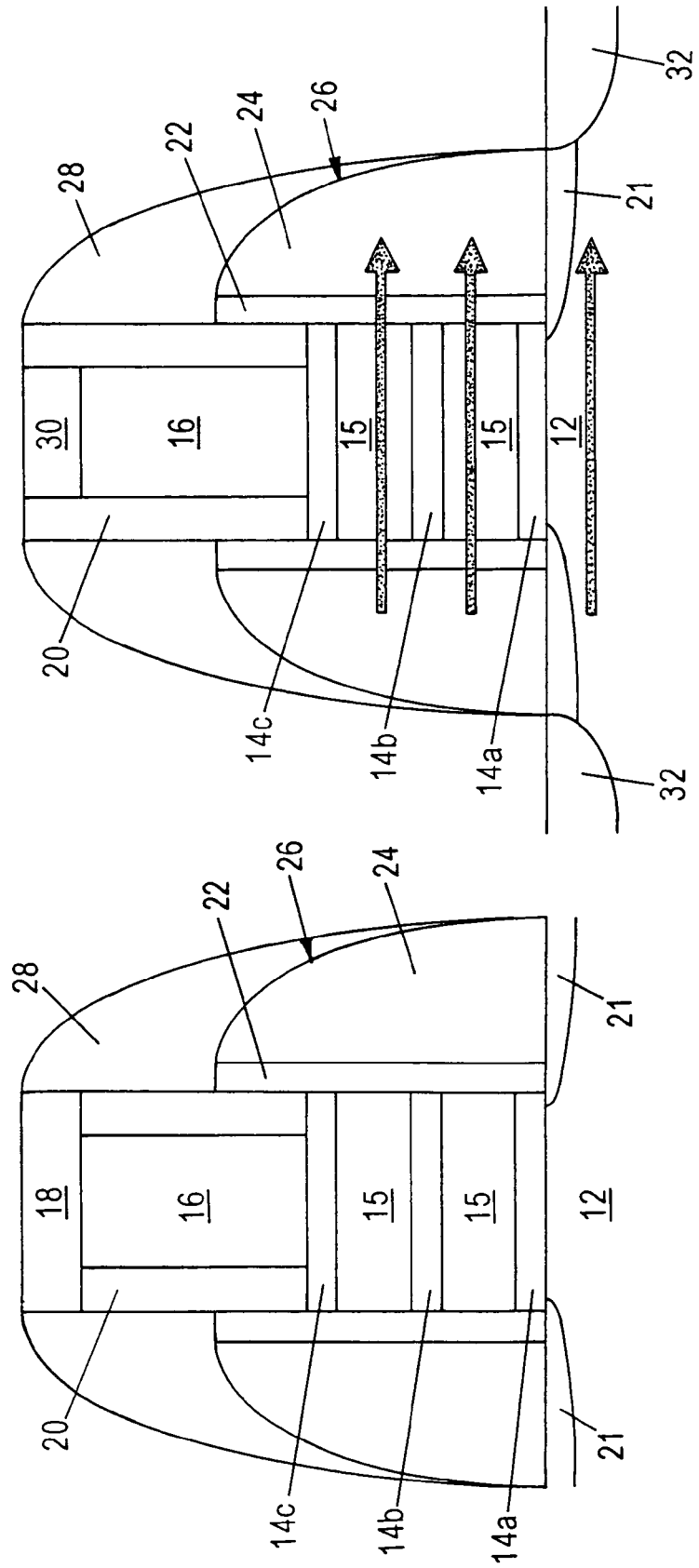

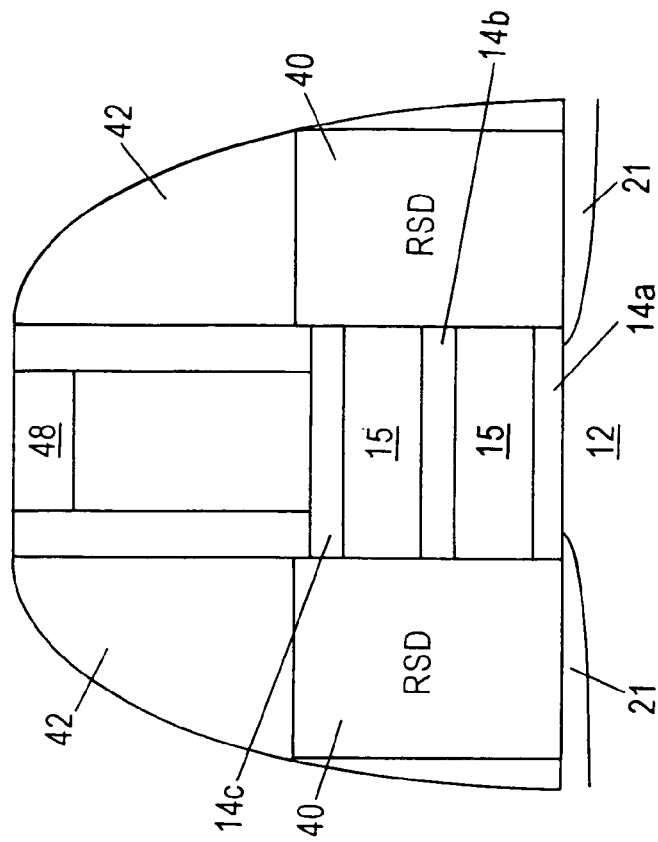
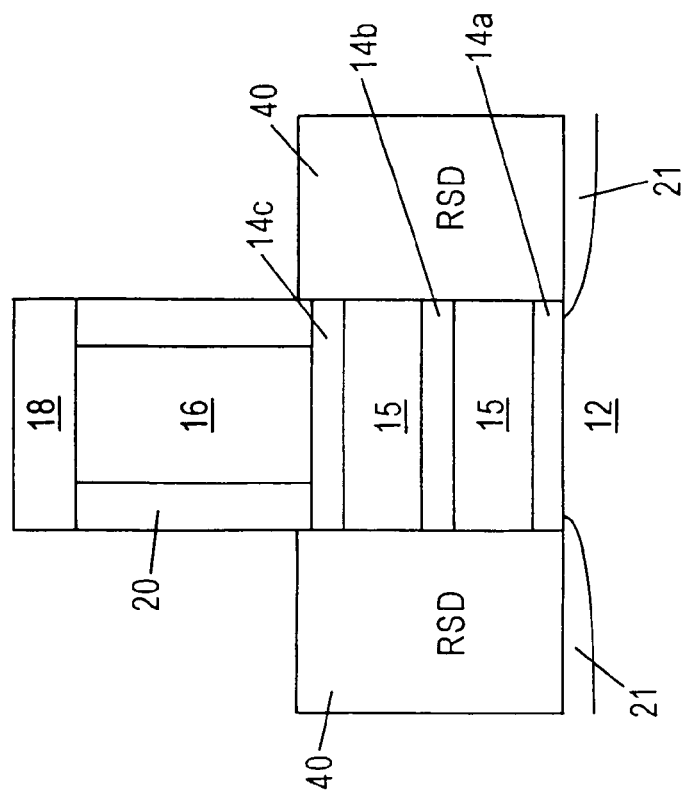
Fig. 7
Fig. 8

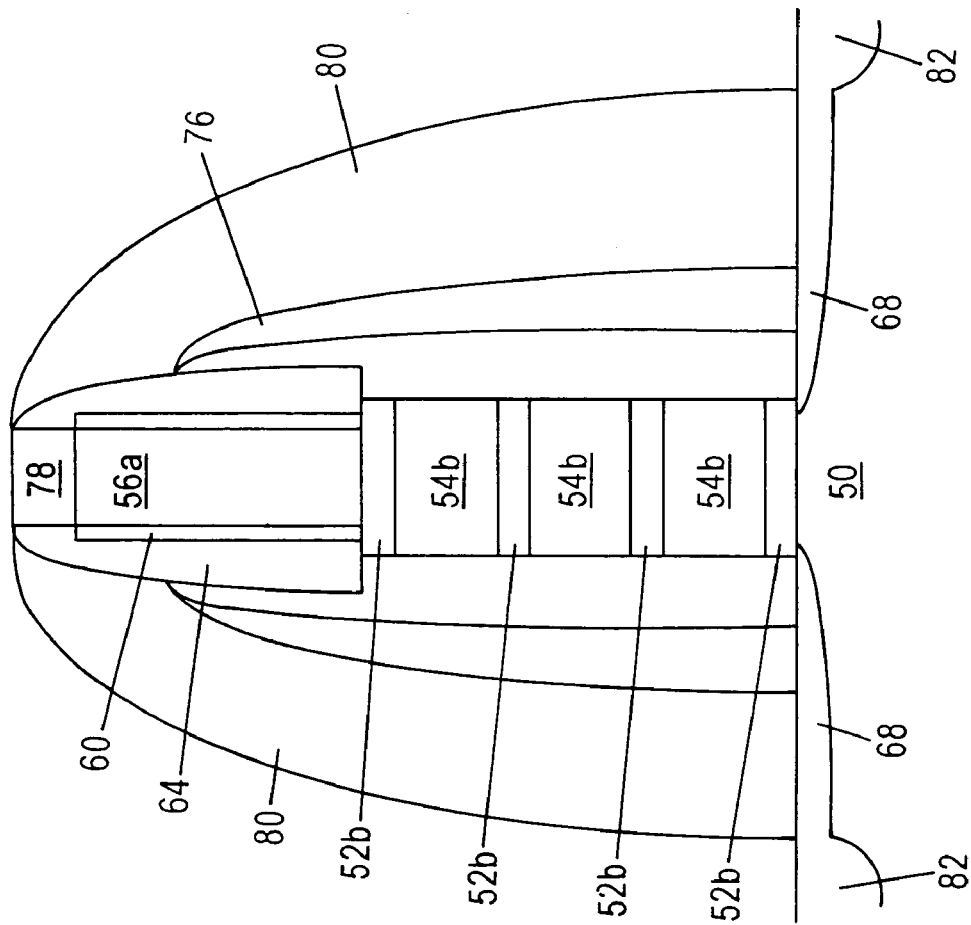
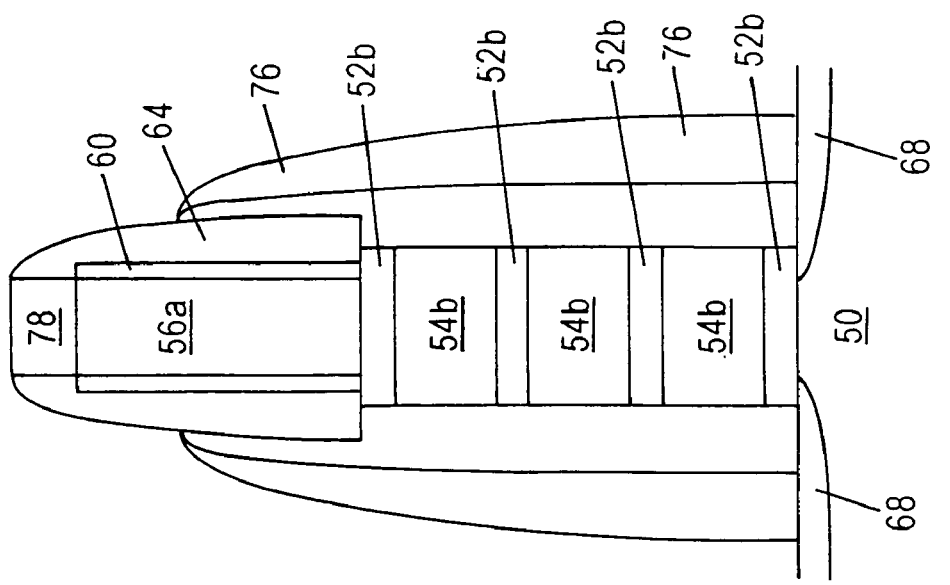

LOW-POWER MULTIPLE-CHANNEL FULLY DEPLETED QUANTUM WELL CMOSFETS

FIELD OF THE INVENTION

The present invention relates to the field of semiconductor devices and manufacture, and more particularly, to multi-channel devices.

BACKGROUND OF THE INVENTION

A conventional MOSFET operates by driving current through the channel region between the source and drain of a device. The conductivity of the channel region is modulated by the application of a voltage on the conducting gate above the channel surface and insulated from it. Efforts are ongoing within many MOS integrated circuit manufacturing companies as well as at many universities and government laboratories to improve the speed and available drive currents with MOSFETs to reduce their power consumption, and to improve their reliability and radiation hardness for applications in harsher remote environments, including space.

One of the goals in semiconductor processing is to maximize the use of the available silicon area. This allows increased miniaturization of the electronic circuitry. In particular, it is desirable to maximize the drive current for a given silicon area. This has included devices in which multiple gates are provided. For example, dual gate devices in which the drive current is doubled for a given silicon area have been created. Further improvements in maximizing the drive current for a given silicon area are desirable.

SUMMARY OF THE INVENTION

There is a need for providing a MOSFET in which the transistor drive is increased, while reducing gate leakage current and gate capacitance. Due to the requirements for miniaturization, such as the push towards sub-45 nm ULSI (ultra large scale integration). This increase in current drive should be obtained without an increase in device size or change in layout design.

These and other needs are met by embodiments of the present invention that provide a multiple-channel semiconductor device comprising a first insulator layer on a substrate and a first channel region on the first insulator layer. A second insulator layer is provided on the first channel region. A second channel region is on the second insulator layer, and a third insulator layer is on the second channel region. A gate electrode is provided on the third insulator layer.

The present invention thus provides a device that has a gate electrode and multiple channel regions which allow for increased drive current without an increase in device size.

The earlier stated needs are also met by embodiments of the present invention which provide a method of forming a multiple-channel semiconductor device comprising the steps of forming a stack on a substrate, this stack including at least two lightly doped channel regions vertically separated from each other and from the substrate by insulator layers. A gate electrode of the stack is separated from the channel regions by a insulator layer. An oxide layer is formed on the sidewalls of the gate electrode and source and drain regions are formed that contact sidewalls of the channel regions. Gate electrode spacers are formed on the oxide liner on the gate electrode.

The methods of the invention allow for formation of a multiple-channel device that does not occupy a greater amount of real estate than previous devices, but yet provides more drive current than conventional devices. The method may find particular utility in sub-45 nm applications, for example.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 5 depicts the structure of FIG. 4 following the formation of an oxide or nitride spacer on the gate electrode and silicon spacers.

FIG. 6 shows the structure of FIG. 5 after a source and drain implantation and the formation of a silicide region in the gate electrode, in accordance with embodiments of the present invention.

FIG. 7 shows an alternative embodiment of the present invention that follows FIG. 2 in a process flow, and in which raised source and drain structures are formed in accordance with embodiments of the present invention.

FIG. 8 depicts the structure of FIG. 7 after formation of an oxide or nitride spacer and silicide region in the gate electrode, in accordance with embodiments of the present invention.

FIG. 15 shows the structure of FIG. 14 following matching of the silicon layers to form silicon spacers and the formation of a silicide region on the gate electrode, in accordance with embodiments of the present invention.

FIG. 16 depicts the structure of FIG. 15 following the deposition of nitride or oxide, the etching of the deposited nitride or oxide to form spacers, and source and drain implantation, in accordance with embodiments of the present invention.

DETAILED DESCRIPTION OF THE INVENTION

The present invention addresses and solves problems related to maximizing the drive current for a given silicon area in the formation of MOSFETs and other semiconductor devices. This is achieved, in part, by the creation of a multiple-channel device having multiple channel regions formed on a substrate, with insulator layers separating the channel regions vertically and from the substrate. The gate electrode is provided on the uppermost channel region, with an insulator layer interposed between the gate electrode and the uppermost channel region. Source and drain regions are formed vertically to contact the multiple channel regions. Verticality of the semiconductor device thus formed provides increased drive current through the multiple channels without increasing the silicon area required for the semiconductor device.

FIGS. 1–6 describe a method of making a multiple-channel device in accordance with embodiments of the present invention. The description will discuss certain materials and process steps in an exemplary manner, but it should be recognized that these materials and process steps are exemplary only as other materials and process steps may be employed without departing from the scope of the present invention.

Figure 1:
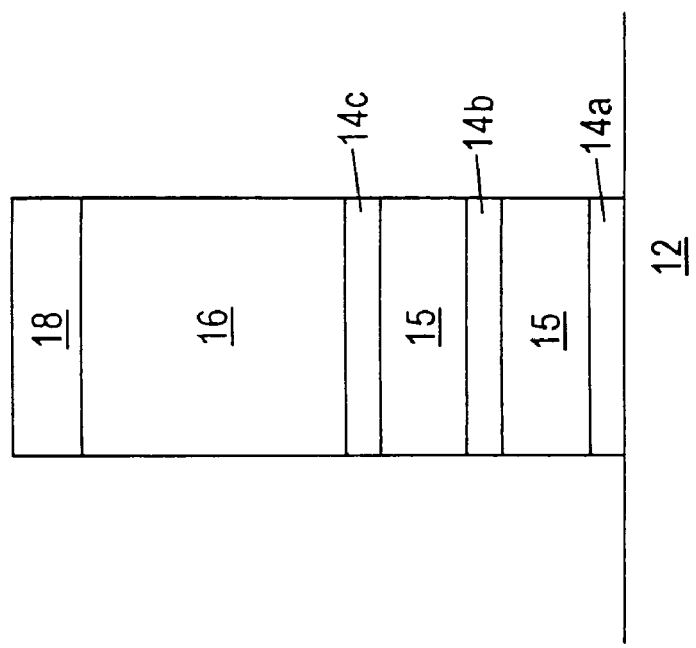
FIG. 1 depicts a stack formed in accordance with embodiments of the present invention after an etching of layers has been performed to create the stack.

FIG. 1 depicts a stack 10 that has been created on a substrate 12 by a dry etching of layers that have been previously formed. The stack 10 of FIG. 1 includes a first oxide layer 14a, a lightly doped polysilicon (hereafter silicon) layer 15, another oxide layer 14b, a second lightly doped silicon layer 15, and a third oxide layer 14c. The third oxide layer 14c forms a gate oxide layer in FIG. 1. The stack 10 includes a heavily doped polysilicon channel 16 and a hard mask 18, on the silicon nitride, for example, or other hard mask material.

In preferred embodiments of the invention, the silicon in each layer 15 is doped prior to the formation of the next layer. The silicon layers 15 are doped with a first conductivity type, such as p conductivity type, and gate electrode 16 is doped with a second conductivity type, such as n conductivity type. Alternatively, the gate electrode 16 is doped with p type dopants while the silicon in channel regions 15 are doped with n type dopants. Furthermore, the silicon regions 15 and 16 may comprise other semiconductor materials, such as silicon germanium (SiGe).

Figure 2:
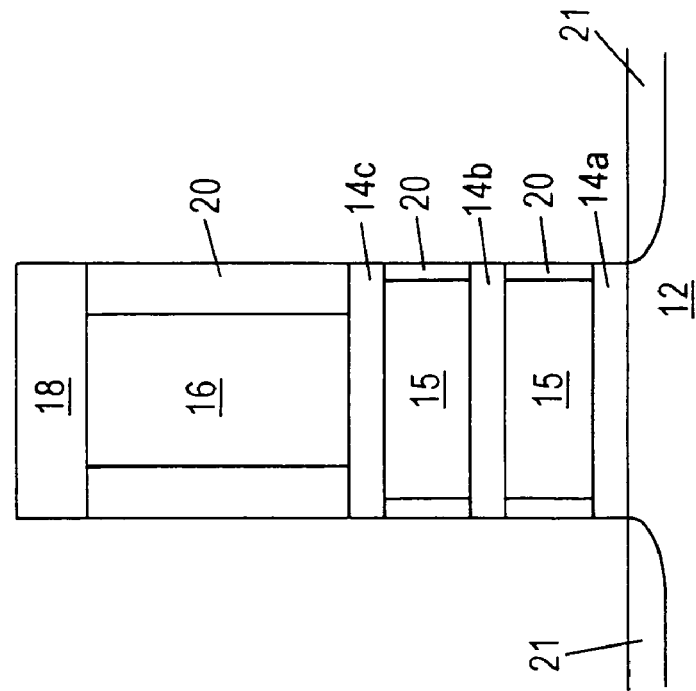
FIG. 2 depicts the structure of FIG. 1 following a thermal oxidation process and a source and drain extension implant, in accordance with embodiments of the present invention.

Following the formation of the stack 10, a thermal oxidation process is performed, the results of which are depicted in FIG. 2. For example, the stack may be exposed to temperatures of between about 900° to 1000° for approximately less than 10 minutes in an environment suitable for oxidation, as is well known. Strict control of the thermal oxidation process is necessary, especially in applications such as sub-45 nm ULSI devices, to prevent the gate electrode 16 from becoming over oxidized. This may readily occur since heavily doped silicon, such as that in the gate electrode 16, allows oxide to grow much faster than in lightly doped silicon, such as in the channel regions 15.

FIG. 2 also shows the formation of source and drain extensions by source and drain extension implants 21. This may be performed in a conventional manner.

Figure 3:
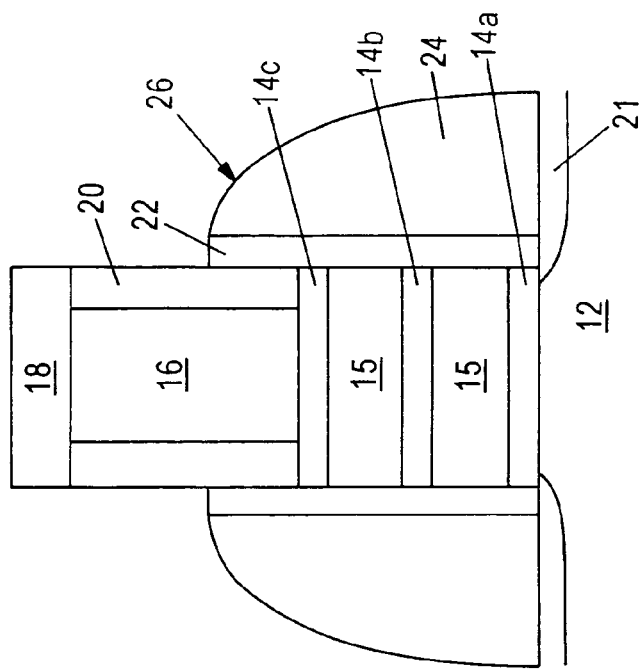
FIG. 3 depicts the structure of FIG. 2 following a lightly doped silicon deposition and a heavily doped silicon deposition, in accordance with embodiments of the present invention.

FIG. 3 shows the structure of FIG. 2 following the sequential deposition of a lightly doped silicon layer 22 and a heavily doped silicon layer 24. The layers 22 and 24 are doped with the same conductivity type dopant as in the gate electrode 16. Hence, in the exemplary embodiment being described, the dopant is an n-type dopant. Deposition of the silicon layers 22 and 24 may be performed by chemical vapor deposition (CVD) for example. It is preferred to deposit doped silicon layers rather than attempting to dope by ion implantation the silicon layers after they have been deposited, since control of the implantation process to form a lightly doped region and heavier doped regions is difficult to control in this arrangement. However, it is also possible to perform implanting to achieve the desired doping, and certain embodiments of the invention perform such implanting.

A silicon etch is then performed to form silicon spacers 26 that include the lightly doped regions 22 and the heavily doped regions 24. The silicon spacers 26 contact the first and second channel regions 15 but are electrically isolated from the gate electrode 16 by the thermal oxide 20.

Figure 4:
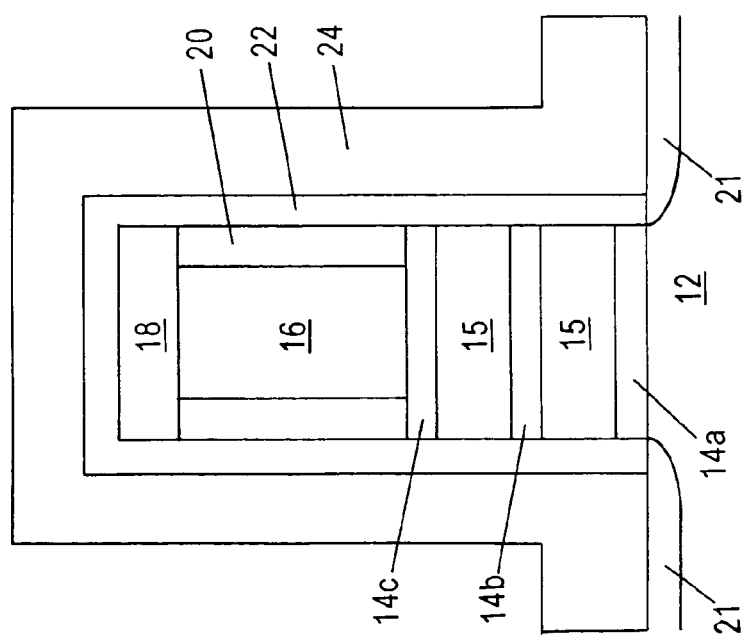
FIG. 4 shows the structure of FIG. 3 after a silicon spacer etch has been performed, in accordance with embodiments of the present invention.

FIG. 5 shows the structure of FIG. 4 following the deposition of an insulating spacer material and a dry etch procedure that forms spacers 28 over the silicon spacers 26. The insulating material may be an oxide or nitride or other suitable material, for example.

FIG. 6 depicts the structure of FIG. 5 after the hard mask 18 has been removed by etching, for example. A portion of the gate electrode 16 is silicided to form a silicide region 30 by conventional silicide techniques, including the deposition of a refractory metal layer and annealing to silicidize a portion of the gate electrode 16.

A source and drain implant process is performed in a conventional manner to create source and drain regions 32 in a substrate 12. The spacers 26, 28 serve as a mask during the source and drain implant process.

The arrows in FIG. 6 represent an exemplary electron flow through the multiple channels created in the device of the present invention. Hence, while not increasing the width of the semiconductor device, the multiple channels (three such channels in FIG. 6 embodiment) provide increased electron flow and drive current. Further, gate leakage current and gate capacitance are reduced.

In certain embodiments of the invention, the gate electrode 16 may be formed of a metal or completely silicidized. The metal gate may be a replacement metal gate, or may be formed initially. Furthermore, one or more of the insulator layers 14a–14c may consist of a high k gate dielectric material, rather than a relatively lower k oxide or other material.

FIGS. 7 and 8 show structures constructed in accordance with another embodiment of the present invention. Following the thermal oxidation and source and drain extension implant steps of FIG. 2, FIG. 7 provides for a raised source and drain formation process. This is performed, for example, by growing silicon on the substrate 12 in a known manner, and then etching the silicon to form the raised source and drains 40.

In FIG. 8, an insulating spacer 42 has been formed over the raised source and drains 40. Spacers 42 are formed from an oxide or nitride, for example. A silicide region 48 is formed on the gate electrode 16, in a manner as described earlier.

FIGS. 9–16 depict still another embodiment of the present invention that may be considered especially preferred since it avoids the risks of thermal oxidation that are especially present in very small devices.

Figure 9:
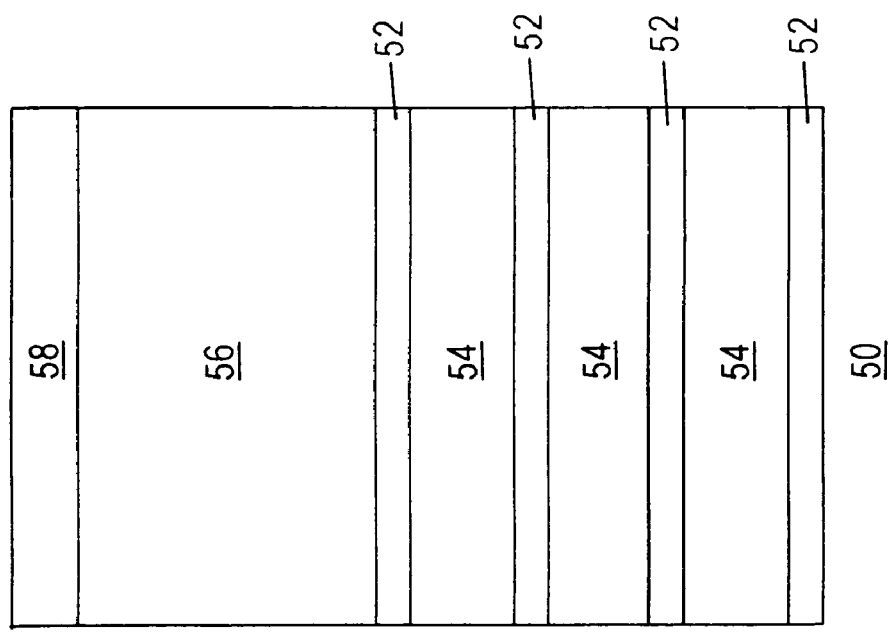
FIG. 9 depicts layers in an alternate embodiment of the present invention prior to etching of the layers.

FIG. 9 shows a number of layers on a substrate 50. The layers include insulator layers 52, made of an oxide, for example. Other materials may be used, such as high K gate dielectrics, for example. Lightly doped semiconductor channel regions 54 are provided between the insulator layers 52. A gate electrode layer 56 is provided on the uppermost insulator layer 52. A hard mask layer 58 is provided on the gate electrode layer 56. As in earlier described embodiments, the gate electrode layer 56 may be formed from a heavily doped silicon or silicon germanium layer, and the channel layers 54 may be formed of a lightly doped silicon or silicon germanium material. The conductivity types of the dopants in the gate electrode layer 56 and the channel layers 54 are of opposite types. In the described exemplary embodiment, for purposes of explanation and illustration, the gate electrode layer 56 is considered to have been heavily doped with n type dopants, while the channel layers 54 will be considered to have been lightly doped with p-type dopants.

Figure 10:
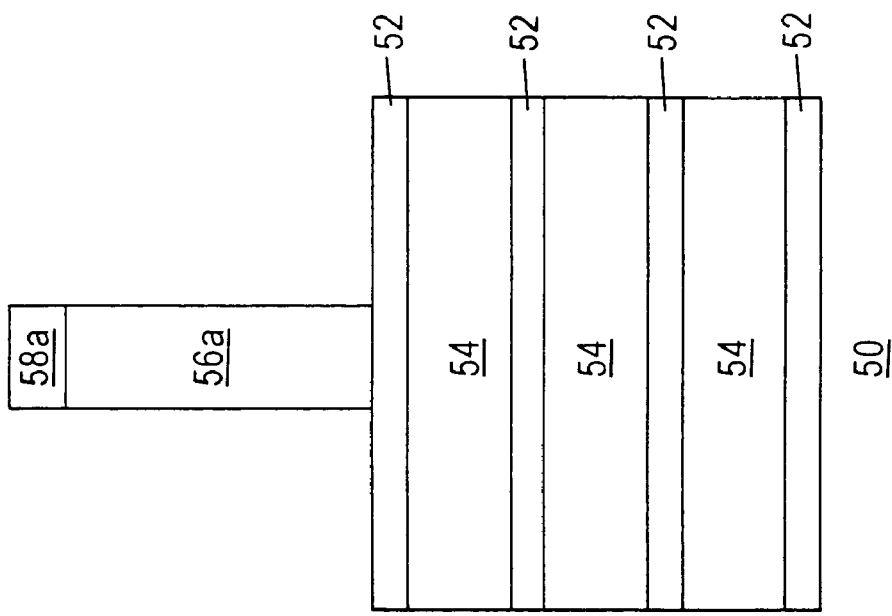
FIG. 10 shows the structure of FIG. 9 after the gate electrode and the hard mask have been etched, in accordance with embodiments of the present invention.

Following the formation of the layers in FIG. 9, a dry etching is performed to shape the gate, the results of which are depicted in FIG. 10. The gate electrode 56a is thus created, with the dry etching stopping on the gate insulator layer 52, which forms the uppermost insulator layer in the stack. The hard mask 58a is also etched at this time. A conventional dry etching technique may be employed.

Figure 11:
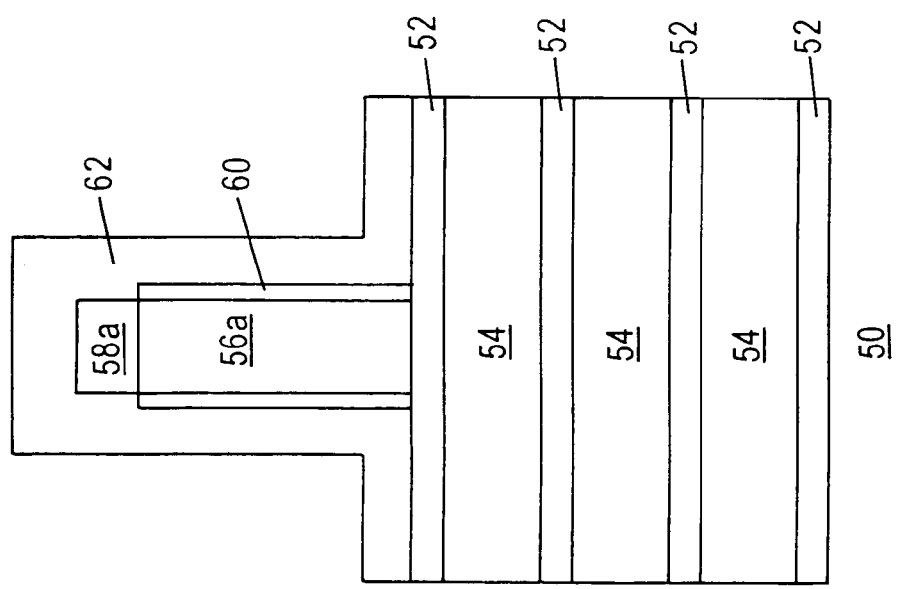
FIG. 11 shows the structure of FIG. 10 after the formation of a thermal oxide liner on the gate electrode and the deposition of gate electrode spacer material over the gate electrode and the hard mask.

FIG. 11 shows the structure of FIG. 10 after a thermal oxide liner 60 has been formed on the gate electrode 56a to serve as protection for the gate electrode 56a. Subsequent to the formation of the thermal oxide liner 60, a second insulator layer, such as nitride, is deposited by CVD, for example.

Figure 12:
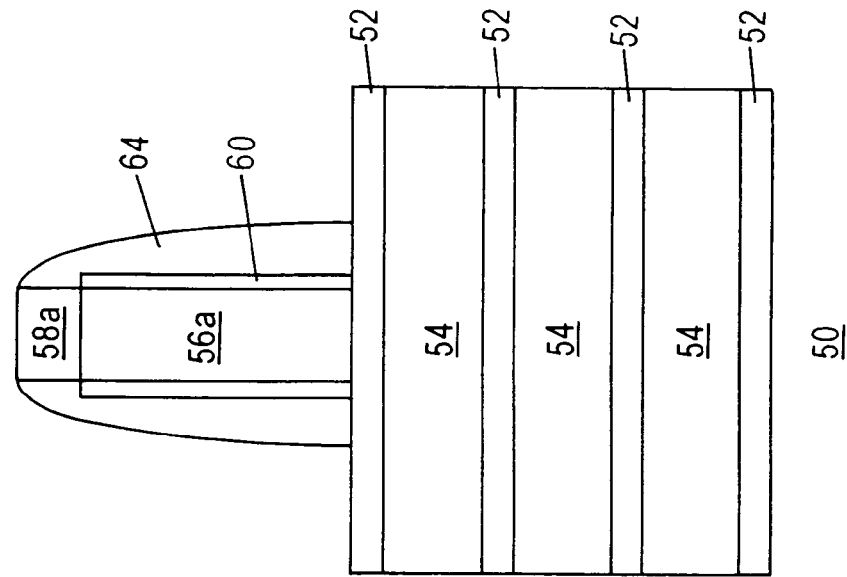
FIG. 12 depicts the structure of FIG. 11 following a spacer etching to form gate electrode spacers in accordance with embodiments of the present invention.

A spacer dry etch step is then performed, the results of which are depicted in FIG. 12. The spacer dry etch stops on the top insulator layer 52. The dry etch creates gate electrode spacers 64 on the thermal oxide liner 60. A conventional dry etch process may be employed in this step.

A second etching procedure is then performed, using a dry etch, to create a stack 66. The etching employs the gate electrode spacers 64 as a mask, while insulator layers 52 and channel layers 54 are etched. The dry etch is stopped on the bottom insulator layer 52 for control purposes to prevent damage to the silicon substrate 50.

Figure 14:
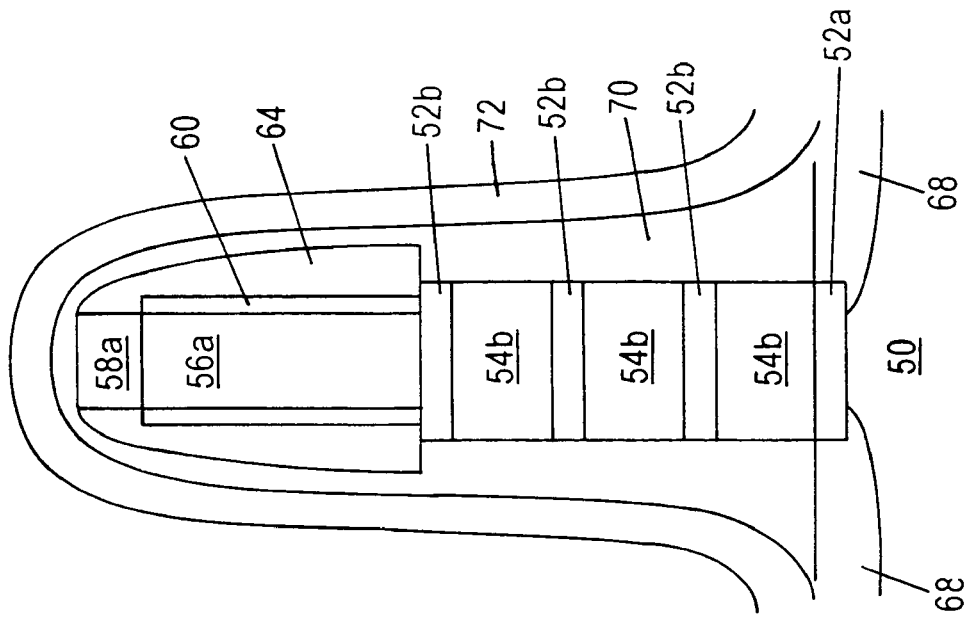
FIG. 14 shows the structure of FIG. 13 following an extension implantation process, with a wet etch that recesses the stack and a silicon deposition over the stack, in accordance with embodiments of the present invention.
Figure 13:
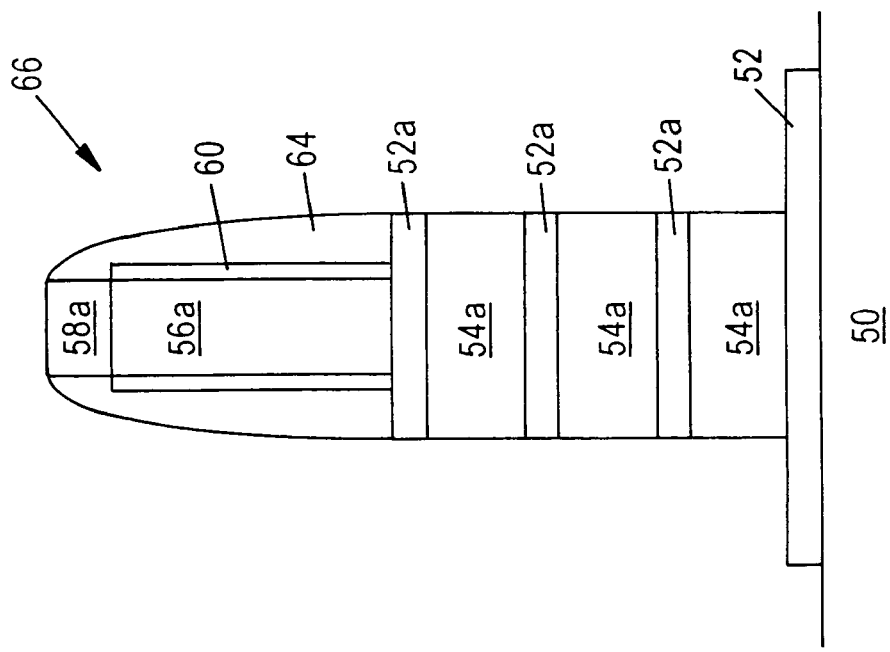
FIG. 13 shows the structure of FIG. 12 after a dry etch has been performed to create the stack, in accordance with embodiments of the present invention.

FIG. 14 shows the structure of FIG. 13 following an extension implant of the same type dopants as provided in the gate electrode 56a. The implants create extensions 68 in a substrate 50. Following the extension implant, a wet etch process is performed that recesses the stack underneath the gate electrode spacer 64. It also serves to remove a portion of the bottom insulator layer 52. However, a second wet etch may be performed to remove more of the bottom insulator layer 52 if necessary to cause it to form the structure depicted in FIG. 14. The recessing of the stack 66, including channel regions 54a and insulator regions 52a, allows the diffusion of the extension implants to reach the channel under the gate electrode 56a.

Following the recessing of the stack 66, a multi-step polysilicon deposition process is performed to subsequently deposit a lightly doped polysilicon layer 70 over the stack 66, followed by a heavily doped polysilicon layer 72 over the lightly doped polysilicon layer. The dopant conductivity type is the same as in gate electrode 56a and in the extension implants 68. In this example, the dopant conductivity type is n-type dopant. The deposition of the polysilicon layer 70, 72 may be by chemical vapor deposition (CVD) or other appropriate methodologies.

FIG. 15 shows the structure of FIG. 14 following a dry etch of the silicon layer 70, 72 to form silicon spacers 76, having a lightly doped region and a heavily doped region. At this time, silicide can then be formed on the silicon spacers 76 and in the gate electrode 56a, once the hard mask 58a has been removed by appropriate etching techniques.

FIG. 16 depicts the structure of FIG. 15 following the formation of an insulator spacer 80, made of nitride or oxide or other suitable material, for example. A source and drain implant is then performed to create source and drain regions 82 in the substrate 50.

Three separate channel regioins 54b are decipited in the structure of FIG. 16, providing for a total of four channels (including the channel formed in the substrate 50). Hence, it should be clear to those of ordinary skill in the art that the number of channel regions may be varied in different embodiments.

The present invention thus provides for a semiconductor device and method for making the same that has a greater drive current than previous devices, but without occupying a greater amount of silicon area than conventional devices.

Although the present invention has been described and illustrated in detail, it is to be clearly understood that the same is by way of illustration and example only and is not to be taken by way of limitation, the scope of the present invention being limited only by the terms of the appended claim.

What is claimed is:

1. A method of forming a multiple channel semiconductor device, comprising the steps:
   forming a stack on a substrate, the stack including at least two lightly doped channel regions vertically separated from each other and from the substrate by insulator layers, and a gate electrode separated from the channel regions by an insulator layer;
   forming an oxide liner on sidewalls of the gate electrode includes forming a thermal oxide liner on the sidewalls of the gate electrode;
   forming source and drain regions contacting sidewalls of the channel regions; and
   forming gate electrode spacers on the oxide liner on the gate electrode, which includes depositing nitride on the oxide liner and the gate electrode and performing a spacer etch stopping on the insulator layer separating the gate electrode from the channel regions.

2. The method of claim 1, wherein the step or forming a stack includes dry etching the insulator layers and the channel regions after the gate electrode spacers are formed, stopping the dry etching on the insulator layer separating the channel regions from the substrate.

3. The method of claim 2, further comprising implanting source and drain extensions into the substrate after the dry etching.

4. The method of claim 3, wherein the step forming source and drain regions includes depositing a lightly doped semiconductor layer over the stack and the gate electrode spacers after the implanting of the source and drain extensions, and depositing a heavily doped semiconductor layer over the lightly doped semiconductor layer.

5. The method of claim 4, wherein the step of forming source and drain regions further includes dry etching the lightly doped and heavily doped semiconductor layers to form semiconductor spacers on the sidewalls of the channel regions.

6. The method of claim 5, further comprising forming device spacers on the semiconductor spacers and performing a service and drain implantation into the substrate with the device spacers masking the source and drain extensions.

* * * * *